(12) United States Patent
Masuoka et al.

(10) Patent No.: US 7,498,626 B2
(45) Date of Patent: Mar. 3, 2009

(54) SEMICONDUCTOR DEVICE AND METHOD OF MANUFACTURING THE SAME

(75) Inventors: Sadaaki Masuoka, Kawasaki (JP); Hiroaki Ohkubo, Kawasaki (JP); Yasutaka Nakashiba, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/204,163

(22) Filed: Aug. 16, 2005

(65) Prior Publication Data

US 2006/0033139 A1 Feb. 16, 2006

(30) Foreign Application Priority Data

Aug. 16, 2004 (JP) ............................. 2004-236770

(51) Int. Cl.
*H01L 51/05* (2006.01)
(52) U.S. Cl. .................. 257/296; 257/379; 257/382; 257/516; 257/532; 257/E27.034; 257/E29.02
(58) Field of Classification Search ................ 257/379, 257/382, 516, 532, E27.034, E29.02, 277, 257/296, 310, E29.345
See application file for complete search history.

(56) References Cited

U.S. PATENT DOCUMENTS

| | | | | |
|---|---|---|---|---|
| 4,811,076 A | * | 3/1989 | Tigelaar et al. ............. | 257/306 |
| 5,220,191 A | * | 6/1993 | Matsushita ................... | 257/499 |
| 5,457,065 A | * | 10/1995 | Huang et al. ................. | 438/397 |
| 5,670,808 A | * | 9/1997 | Nishihori et al. ............ | 257/310 |
| 6,057,572 A | * | 5/2000 | Ito et al. ...................... | 257/296 |
| 2004/0043558 A1 | * | 3/2004 | Wieczorek et al. .......... | 438/241 |

FOREIGN PATENT DOCUMENTS

| JP | 2002-222924 | 8/2002 |
|---|---|---|
| JP | 2003-017592 | 1/2003 |

* cited by examiner

*Primary Examiner*—Ngan Ngo
*Assistant Examiner*—Benjamin Tzu-Hung Liu
(74) *Attorney, Agent, or Firm*—Young & Thompson

(57) ABSTRACT

The present invention provides a semiconductor device comprising a capacitive element with a very uniform capacitive value as well as a method of manufacturing the semiconductor device. In a capacitive element formation region 20 of a semiconductor device 1, an N-type well 22 as a conductive layer is formed in a surface layer of a P-type semiconductor substrate 10. A capacitive film 24 is deposited on a front surface of the semiconductor substrate 10 on which the N-type well 22 is formed. The part of front surface of the semiconductor substrate 10 in which the capacitive film 24 is deposited is substantially flat. An upper electrode 26 is provided on the capacitive film 24. The upper electrode 26 constitutes a capacitive element (on-chip capacitor) together with the N-type well 22, located opposite the upper electrode 26 across the capacitive film 24.

20 Claims, 4 Drawing Sheets

SEMICONDUCTOR DEVICE AND METHOD OF MANUFACTURING THE SAME

This application is based on Japanese patent application NO. 2004-236770, the content of which is incorporated hereinto by reference.

DISCLOSURE OF THE INVENTION

1. Field of the Invention

The present invention relates to a semiconductor device and a method of manufacturing the semiconductor device.

2. Description of the Related Art

Conventional semiconductor devices are described in, for example, Japanese Laid-open patent publication Nos. 2003-17592 and 2002-222924. The semiconductor device described in Japanese Laid-open patent publication No. 2003-17592 comprises a capacitive element provided on the same substrate on which a transistor is provided. In this semiconductor device, a metal film functioning as a lower electrode is provided on a semiconductor substrate. A capacitive film and an upper electrode are sequentially stacked on the metal film.

In the semiconductor device described in Japanese Laid-open patent publication No. 2002-222924, trenches are formed in a region of the semiconductor substrate in which the capacitive element is formed. The capacitive film and the upper electrode are sequentially stacked on the semiconductor substrate having concaves and convexes formed of the trenches on its surface. Further, an impurity diffusion layer is provided in a surface layer of the semiconductor substrate. The capacitive element is composed of the impurity diffusion layer, capacitive film, and upper electrode.

SUMMARY OF THE INVENTION

However, the semiconductor devices described in Japanese Laid-open patent publication Nos. 2003-17592 and 2002-222924 leave room for improvement in terms of the uniformity of capacity value of the capacitive element as described below.

In the semiconductor device described in Japanese Laid-open patent publication No. 2003-17592, the capacitive film is formed directly on the metal film. However, the metal film has a rougher surface than the semiconductor substrate and the like. Accordingly, it is difficult to form a capacitive film having a uniform thickness. The non-uniformity of thickness of the capacitive film may result in a spatial variation in capacity value.

In the semiconductor device described in Japanese Laid-open patent publication No. 2002-222924, the capacitive film is formed on the semiconductor substrate having concaves and convexes formed on its surface. In this case, there is a difference between the concaves and the convexes in the manner in which the capacitive film is deposited on them. It is difficult to make the film thickness of the capacitive film uniform. It is also difficult to obtain a uniform film thickness between the bottom surface and side surface of each concave.

According to the present invention, there is provided a semiconductor device comprising a semiconductor substrate having a conductive layer provided in a surface layer, a capacitive film provided on a substantially flat part of a front surface of the semiconductor substrate, and an upper electrode provided on the capacitive film and constituting a capacitive element together with a conductive layer lying opposite the upper electrode across the capacitive film.

In this semiconductor device, the capacitive film is provided on the substantially flat part on the semiconductor substrate. Since the semiconductor substrate has a smoother surface than metal or the like, a capacitive film with a very uniform film thickness can be provided. This provides a semiconductor device comprising a capacitive element with a very uniform capacity value.

The capacitive film may have an insulating film provided in its surface layer closer to the semiconductor substrate, to prevent diffusion of metal elements. This makes it possible to prevent metal elements in the capacitive film from diffusing to the semiconductor substrate.

The capacitive film may be a high dielectric-constant film having a higher dielectric constant than a silicon oxide film. The capacitive film is preferably thicker in order to suppress a leakage current from the capacitive element. However, the capacity value decreases with increasing thickness of the capacitive film. Thus, by using the high dielectric-constant film as a capacitive film, it is possible to provide a sufficient film thickness to suppress the leakage current, while maintaining a large capacity value.

The semiconductor device may comprise a transistor provided on the semiconductor substrate and constituting an internal circuit of the semiconductor device. The capacitive film may be thicker than a gate insulating film in the transistor. This makes it possible to suppress the leakage current from the capacitive element. In this case, the capacitive film may have a smaller equivalent electrical thickness than the gate insulating film in the transistor.

The equivalent electrical thickness of the capacitive film refers to the film thickness of a silicon oxide film having the same capacity value as that of the capacitive film.

The semiconductor device may comprise an interlayer nitride film provided on the transistor and an insulating film provided on the interlayer nitride film. The insulating film may be integrated with the capacitive film. By providing the insulating film on interlayer nitride film, it is possible to design the thickness of the interlayer nitride film as desired. Further, in a process of manufacturing the semiconductor device, the insulating film may be formed in the same step as that in which the capacitive film is formed. The nitride film as interlayer nitride film includes an oxygen nitride film such as SiON.

The part of the semiconductor substrate in which the capacitive film is provided need not be silicided. Since a non-silicided semiconductor substrate surface is smoother than a silicide surface, the omission of silicidation is suitable for improving the uniformity of film thickness of the capacitive film than the provision of a capacitive film on silicide.

Further, in the semiconductor device, the upper electrode may comprise a metal film. Alternatively, the upper electrode may be formed of polysilicon and have a silicide layer formed in its surface layer.

Moreover, in the semiconductor device, the semiconductor substrate may have a capacitive element formation region and a transistor formation region. The capacitive film, upper electrode, and silicide layer stacked on the front surface of the semiconductor substrate in the capacitive element formation region may be formed of the same materials as those of a gate insulating film, a gate electrode, and a silicide layer, respectively, which are stacked on the front surface of the semiconductor substrate in the transistor formation region. The capacitive film, upper electrode, and silicide layer may also have substantially the same film thicknesses as those of the gate insulating film, gate electrode, and silicide layer. Such a semiconductor device enables a manufacturing process to be simplified and can be easily manufactured.

According to the present invention, there is provided a method of manufacturing a semiconductor device, the method comprising forming a conductive layer in a surface layer of a semiconductor substrate, forming a capacitive film on a substantially flat part of a front surface of the semiconductor substrate on which the conductive layer has been formed, and forming an upper electrode on the capacitive film, the upper electrode constituting a capacitive element together with a conductive layer lying opposite the upper electrode across the capacitive film.

In this manufacturing method, the capacitive film is provided on the substantially flat part on the semiconductor substrate. Since the semiconductor substrate has a smoother surface than metal or the like, a capacitive film with a very uniform film thickness can be provided. This provides a semiconductor device comprising a capacitive element with a very uniform capacity value.

The semiconductor substrate has a transistor formation region and a capacitive element formation region. The manufacturing method includes forming a transistor in the transistor formation region, forming a silicide block in the capacitive element formation region, after the step of forming the transistor and the step of forming the silicide block, siliciding a part of the front surface of the semiconductor substrate in which the silicide block is not formed, and after the step of siliciding the part of the front surface of the semiconductor substrate, removing the silicide block. The step of forming the capacitive film may be executed after the step of removing the silicide block.

According to this manufacturing method, a semiconductor device is obtained in which only the transistor part is silicided, whereas the capacitive element is not silicided. This configuration is suitable both for reducing the parasitic resistance in the transistor and for improving the uniformity of the capacitive film in the capacitive element.

The semiconductor substrate has a capacitive element formation region and a transistor formation region. The manufacturing method may be executed by, during the step of forming the capacitive film, forming the capacitive film on the front surface of the semiconductor substrate in the capacitive element formation region, while simultaneously forming a gate insulating film on the front surface of the semiconductor substrate in the transistor formation region, then during the step of forming the electrode, forming the upper electrode on the capacitive film in the capacitive element formation region, while simultaneously forming a gate electrode on the gate insulating film in the transistor formation region, and then siliciding a surface layer of the upper electrode and a surface layer of the gate electrode at the same time.

This manufacturing method particularly simplifies the manufacturing process.

The present invention provides a semiconductor device comprising a capacitive element with a very uniform capacity value as well as a method of manufacturing the semiconductor device.

BRIEF DESCRIPTION OF THE DRAWINGS

The above and other objects, advantages, and features of the present invention will be more apparent from the following description taken in conjunction with the accompanying drawings, in which.

DETAILED DESCRIPTION OF THE INVENTION

Figure 1:
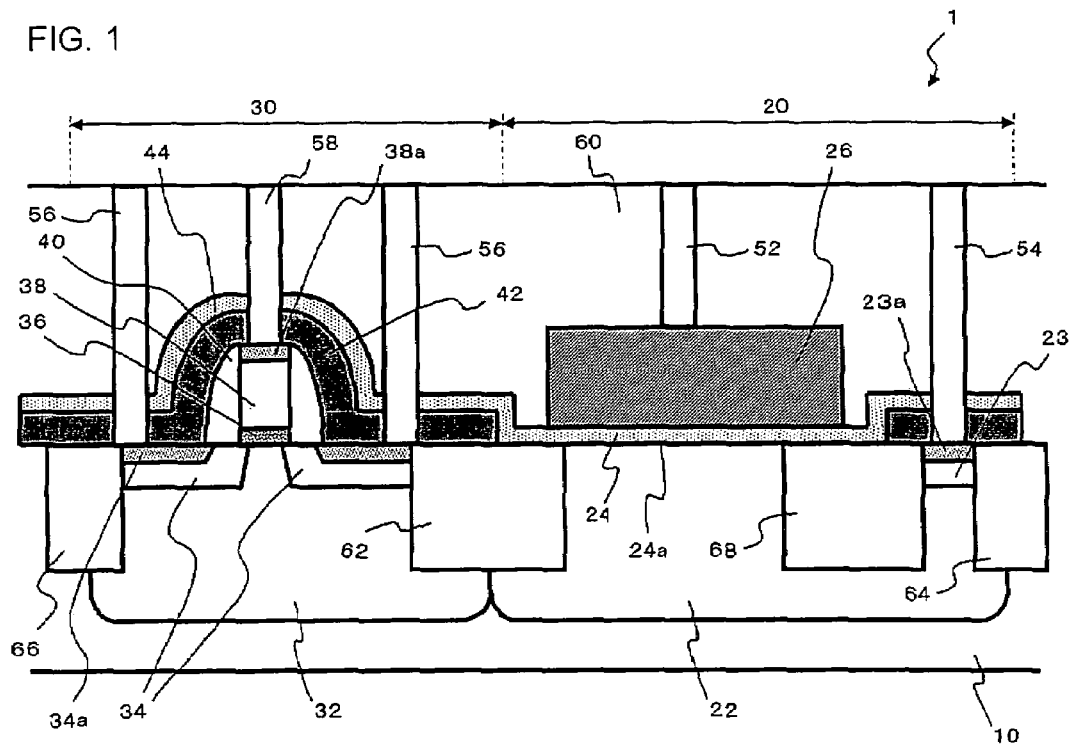
FIG. 1 is a sectional view showing an embodiment of a semiconductor device according to the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

With reference to the drawings, description will be given of preferred embodiments of a semiconductor device and a method of manufacturing the semiconductor device according to the present invention. In the description of the drawings, the same components have the same reference numerals and duplicate descriptions are omitted.

FIG. 1 is a sectional view showing an embodiment of a semiconductor device according to the present invention. A semiconductor device 1 has a capacitive element formation region 20 and a transistor formation region 30. A capacitive element and a transistor are formed in the capacitive element formation region 20 and transistor formation region 30, respectively. In the capacitive element formation region 20 of the semiconductor device 1, an N-type well 22 is formed in a surface layer of a P-type semiconductor substrate 10 as a conductive layer. A diffusion layer 23 for well contact is formed in a part of the N-type well 22. A surface layer 23a of the diffusion layer 23 is silicided. Silicide is, for example, $CoSi_2$ or NiSi. The part in which the diffusion layer 23 is formed contacts a contact 54 for a lower electrode described later. A capacitive film 24 is deposited directly on the part of the front surface of the semiconductor substrate 10 in which the N-type well 22 is formed. The part of the front surface of the semiconductor substrate 10 on which the capacitive film 24 is deposited is substantially flat. The part of the semiconductor substrate 10 in which the capacitive film 24 is provided is not silicided.

The capacitive film 24 is a high dielectric-constant film having a higher dielectric constant than a silicon oxide film. Examples of such a film material include zirconium, hafnium, lanthanoid, aluminum, indium, gallium, or an oxide thereof. That is, possible materials include Zr, Hf, Pr, La, Lu, Eu, Yb, Sm, Ho, Ce, Al, In, Ga, and oxides thereof. Specific examples are $ZrO_x$, $HfO_2$, $HfSiO$, $HfO_x$, $HfAlO_x$, $Al_2O_3$, $In_2O_3$, $Ga_2O_3$, or the like.

An insulating film (metal element diffusion prevention film) 24a preventing diffusion of metal elements is formed in a part of the capacitive film 24. Specifically, the metal element diffusion prevention film 24a is formed in a surface layer of the capacitive film 24 which is closer to the semiconductor substrate 10. For example, an $SiO_2$ film is used as the metal element diffusion prevention film 24a.

An upper electrode 26 is provided on the capacitive film 24. The upper electrode 26 constitutes a capacitive element (on-chip capacitor) together with the N-type well 22, located opposite the upper electrode 26 across the capacitive film 24. That is, the N-type well 22 functions as a lower electrode of the capacitive element. The capacitive element is what is called a MIS (Metal-Insulator-Semiconductor) capacitor. A metal film such as TiN or W may be used as the capacitive element 26. The capacitive element is, for example, interposed between a power source and ground in the semiconductor device 1 and used as a noise canceller.

In the transistor formation region 30 of the semiconductor device 1, a P-type well 32 is formed in the surface layer of the semiconductor substrate 10. A source/drain region 34 is formed in a surface layer of the P-type well 32. A part 34a of surface layer of the source/drain region 34 is silicided. A gate insulating film 36 and a gate electrode 38 are sequentially stacked on the part of the semiconductor substrate 10 in which the P-type well 32 is formed. A surface layer 38a of the gate electrode 38 is silicided. Side surfaces of the gate insulating film 36 and gate electrode 38 are covered with side walls 40. For example, SiON or $SiO_2$ is used as the gate insulating film 36. For example, polysilicon may be used as the gate electrode 38. The capacitive film 24 is thicker than the gate insulating film 36. On the other hand, the capacitive film 24 has a smaller equivalent electrical thickness than the gate insulating film 36.

An N-type MOSFET is composed of the P-type well 32, the source/drain region 34, the gate insulating film 36, and the gate electrode 38. This transistor constitutes an internal circuit in the semiconductor device 1.

An interlayer nitride film 42 is deposited on the transistor. For example, SiN or SiON is used as the interlayer nitride film 42. An insulating film 44 is deposited on the interlayer nitride film 42. The insulating film 44 has the same composition and thickness as those of the capacitive film 24. According to the present embodiment, in particular, the capacitive film 24 and the insulating film 44 are deposited at the same time.

Further, contacts 52, 54, 56, and 58 are formed in the semiconductor device 1. The contacts 52, 54, 56, and 58 are connected to the upper electrode 26, N-type well 22, source/drain region 34, and gate electrode 38, respectively. An interlayer insulating film 60 is formed in the space above the semiconductor substrate 10 so as to cover the entire capacitive element and transistor. Moreover, STIs (Shallow Trench Isolations) 62, 64, 66, and 68 are formed in the semiconductor device 1. The STI 62 separates the capacitive element from the transistor. The STI 64 separates the capacitive element from another element (not shown in the drawings) located rightward adjacent to the capacitive element in the figure. The STI 66 separates the transistor from another element (not shown in the drawings) located leftward adjacent to the capacitive element in the figure. The STI 68 separates the upper electrode from the lower electrode in the capacitive element.

Now, with reference to FIGS. 2 to 5, description will be given of an example of a method of manufacturing the semiconductor device 1 as an embodiment of a method of manufacturing a semiconductor device according to the present invention. First, the semiconductor substrate 10 is prepared. The capacitive element formation region 20 and the transistor formation region 30 are already defined in the semiconductor substrate 10. STIs 62, 64, 66, and 68 are formed at predetermined positions of the semiconductor substrate 10. Subsequently, an N type well 22 is formed in the capacitive element formation region 20 (step of forming a conductive layer). Further, a P-type well 32 is formed in the transistor formation region 30. Moreover, a gate insulating film 36, a gate electrode 38, and a sidewall 40 are formed. Subsequently, source and drain injection is carried out to form a source/drain region 34. In the present embodiment, a diffusion layer 23 is simultaneously formed. Thus, a transistor is formed in the transistor formation region 30 (step of forming a transistor).

Figure 2:
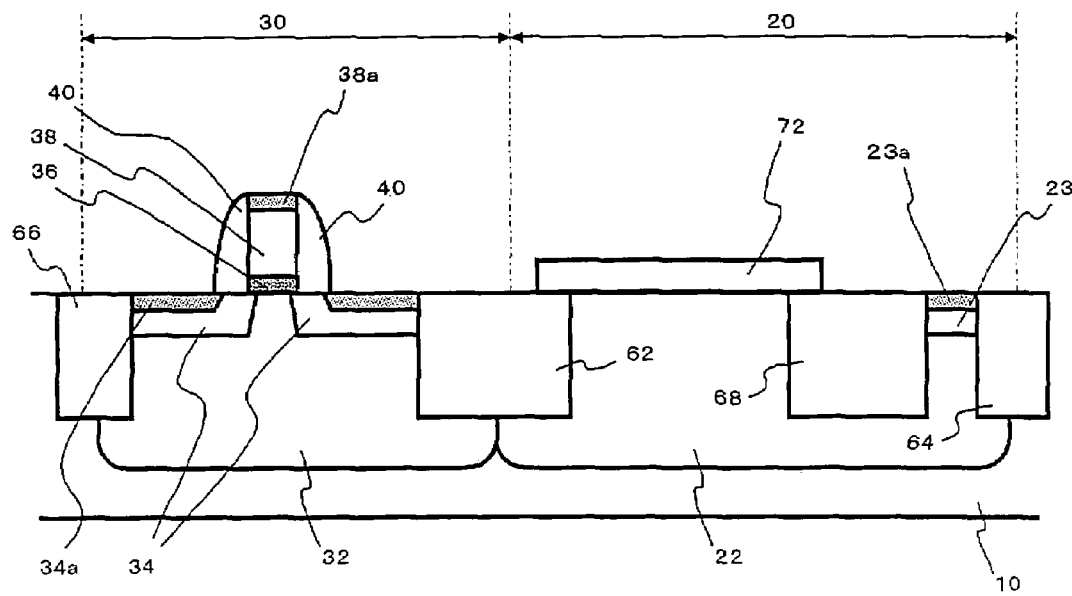
FIG. 2 is a process drawing showing an embodiment of a method of manufacturing a semiconductor device according to the present invention.

Then, a silicide block 72 is formed in a part of the semiconductor substrate 10 in which a capacitive film 24 is to be formed (step of forming a silicide block). For example, $SiO_2$ may be used as the silicide block 72. The silicide block 72 has a thickness of for example, about 20 nm. In this state, the surface layer of the semiconductor substrate 10 is silicided (silicide step). This causes silicidation of the surface layer 23a of the diffusion layer 23, the part 34a of surface layer of the source/drain region 34, and the surface 38a of the gate electrode 38. On the other hand, the part of the semiconductor substrate 10 in which the capacitive element 24 is provided is not silicided (FIG. 2).

Figure 3:
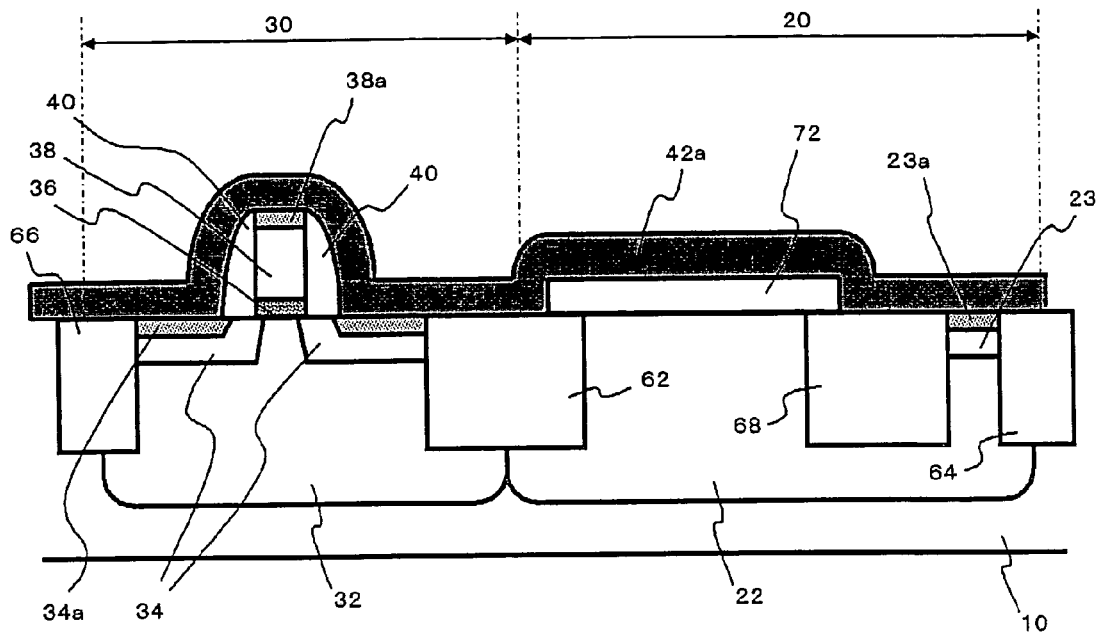
FIG. 3 is a process drawing showing the embodiment of the method of manufacturing a semiconductor device according to the present invention.
Figure 4:
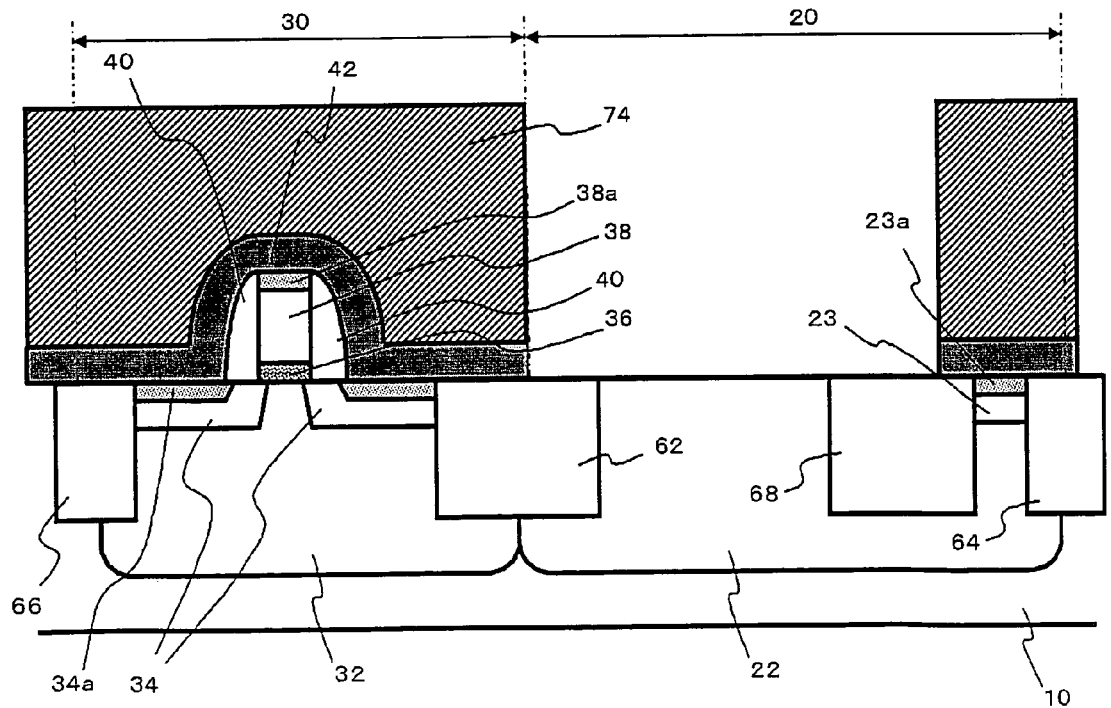
FIG. 4 is a process drawing showing the embodiment of the method of manufacturing a semiconductor device according to the present invention.

Then, an SiN film 42a is grown all over the front surface of the semiconductor substrate 10 (FIG. 3). Subsequently, the surface of the SiN film 42a is covered with a resist 74 except the region in which a capacitive film 24 is to be formed. The SiN film 42a and silicide block 72 on this region are removed by etching (step of removing a silicide block). This allows an interlayer nitride film 42 to be provided on the transistor (FIG. 4).

Figure 5:
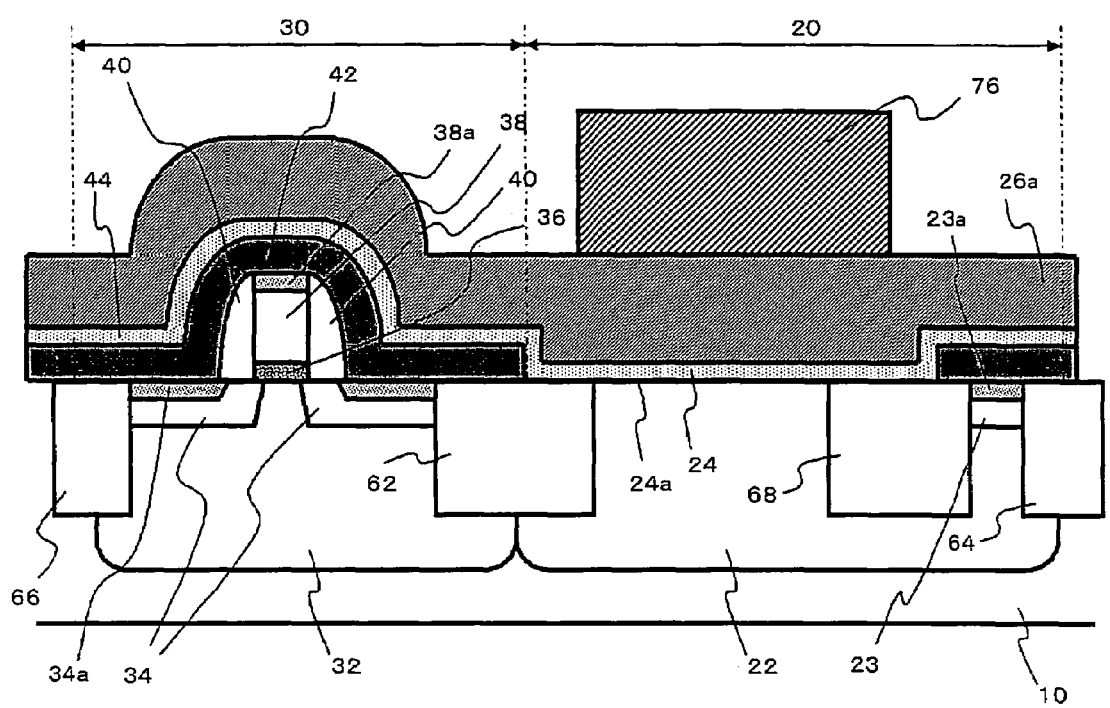
FIG. 5 is a process drawing showing the embodiment of the method of manufacturing a semiconductor device according to the present invention.

Then, the resist 74 is removed. Subsequently, for example, CVD is executed to grow a metal element diffusion prevention film 24a such as $SiO_2$ on the part of the semiconductor substrate 10 from which the SiN film 42a and silicide block 72 have been removed. Subsequently, a high dielectric-constant film such as $HfO_2$ or HfSiO is grown all over the front surface of the semiconductor substrate 10 (step of forming a capacitive film). The high dielectric-constant film constitutes the capacitive film 24 together with the metal element diffusion prevention film 24a in the capacitive element formation region 20. The high dielectric-constant film also becomes an insulating film 44 in the transistor formation region 30. Moreover, a metal film 26a such as TiN or W is formed on the high dielectric-constant film. Subsequently, a region on the metal film 26a which is to be formed into an upper electrode 26 is covered with a resist 76 (FIG. 5).

In this state, etching is carried out to remove the entire metal film 26a except the region in which the upper electrode 26 is to be formed (step of forming an electrode). Moreover, an interlayer insulating film 60 is formed and contacts 52, 54, 56, and 58 are then formed. As a result, the semiconductor 1 shown in FIG. 1 is obtained.

The effects of the present embodiment will be described. In the present embodiment, the capacitive film 24 is provided on the substantially flat part of the semiconductor substrate 10. Since the semiconductor substrate has a smoother surface than metal and the like, it is possible to provide a capacitive film 24 with a uniform film thickness. This provides a semiconductor 1 comprising a capacitive element with a very uniform capacity value.

On the other hand, in the semiconductor device described in Japanese Laid-open patent publication No. 2003-17592, a capacitive film is formed on a metal film, so that it is difficult to obtain a capacitive film with a uniform film thickness. In the semiconductor device described in Japanese Laid-open patent publication No. 2002-222924, a capacitive film is formed on the semiconductor substrate, but the part of the semiconductor substrate surface in which the capacitive film is formed is not flat but is bumpy. Consequently, it is difficult to obtain a uniform film thickness owing to differences in capacitive film deposition conditions between concaves and convexes.

The metal element diffusion prevention film 24a is provided in the surface layer of the capacitive film 24 which is closer to the semiconductor substrate 10. This makes it possible to prevent metal elements in the capacitive film 24 from being diffused to the semiconductor substrate 10. However, the provision of the metal element diffusion prevention film 24a is not essential but may be omitted.

A high dielectric-constant film is used as the capacitive film 24. The capacitive film 24 is preferably thicker in order to suppress a leakage current in the capacitive element. However, the capacity value decreases with increasing thickness of the capacitive film 24. Thus, by using the high dielectric-constant film as the capacitive film 24, it is possible to provide a sufficient film thickness to suppress the leakage current, while maintaining a large capacity value. However, it is not essential to use the high dielectric-constant film as the capacitive film 24. For example, an SiON film or an $SiO_2$ film may be used as the capacitive film 24.

The capacitive film 24 is thicker than the gate insulating film 36 in the transistor. This makes it possible to suppress the leakage current in the capacitive element. Further, the capacitive film 24 has a smaller equivalent electrical thickness than the gate insulating film 36. It is thus possible to obtain a large capacity value while suppressing the leakage current. However, the thickness of the capacitive film 24 may be equal to or smaller than that of the gate insulating film 36 in the transistor. Further, the equivalent electrical thickness of the capacitive film 24 may be equal to or larger than that of the gate insulating film 36 in the transistor.

The insulating film 44 formed simultaneously with the capacitive film 24 is provided on the interlayer nitride film 42. This enables the thickness of the interlayer nitride film 42 to be designed as desired. That is, if the interlayer nitride film 42 must be used as an etching stopper when openings for contacts are formed, the interlayer nitride film 42 is preferably thinner. Consequently, a certain restriction is imposed on the film thickness of the interlayer nitride film 42. In this regard, in the semiconductor device 1, the insulating film 44 functions as an etching stopper, thus eliminating the restriction on the interlayer nitride film 42. Therefore, the provision of the insulating layer 44 increases the degree of freedom in the thickness of the interlayer nitride film 42. It is preferable to increase the degree of freedom in the thickness of the interlayer nitride film 42 in order to control the characteristics of the transistor located immediately below the interlayer nitride film 42. Further, in the process of manufacturing the semiconductor device 1, the insulating film 44 can be formed during the same step as that in which the capacitive film 24 is formed. However, the provision of the insulating film 44 is not essential but may be omitted.

The part of the semiconductor substrate 10 in which the capacitive film 24 is provided is not silicided. Since a non-silicided semiconductor substrate surface is smoother than a silicide surface, the omission of silicidation is suitable for improving the uniformity of film thickness of the capacitive film 24 than the provision of the capacitive film 24 on silicide. In particular, the present embodiment provides the semiconductor device 1 in which only the transistor is silicided, whereas the capacitive element is not silicided. This configuration is suitable both for reducing the parasitic resistance in the transistor and for improving the uniformity of the capacitive film in the capacitive element. However, it is unessential that the part of the semiconductor substrate 10 in which the capacitive film 24 is provided be not silicided. This part may be silicided.

Figure 6:
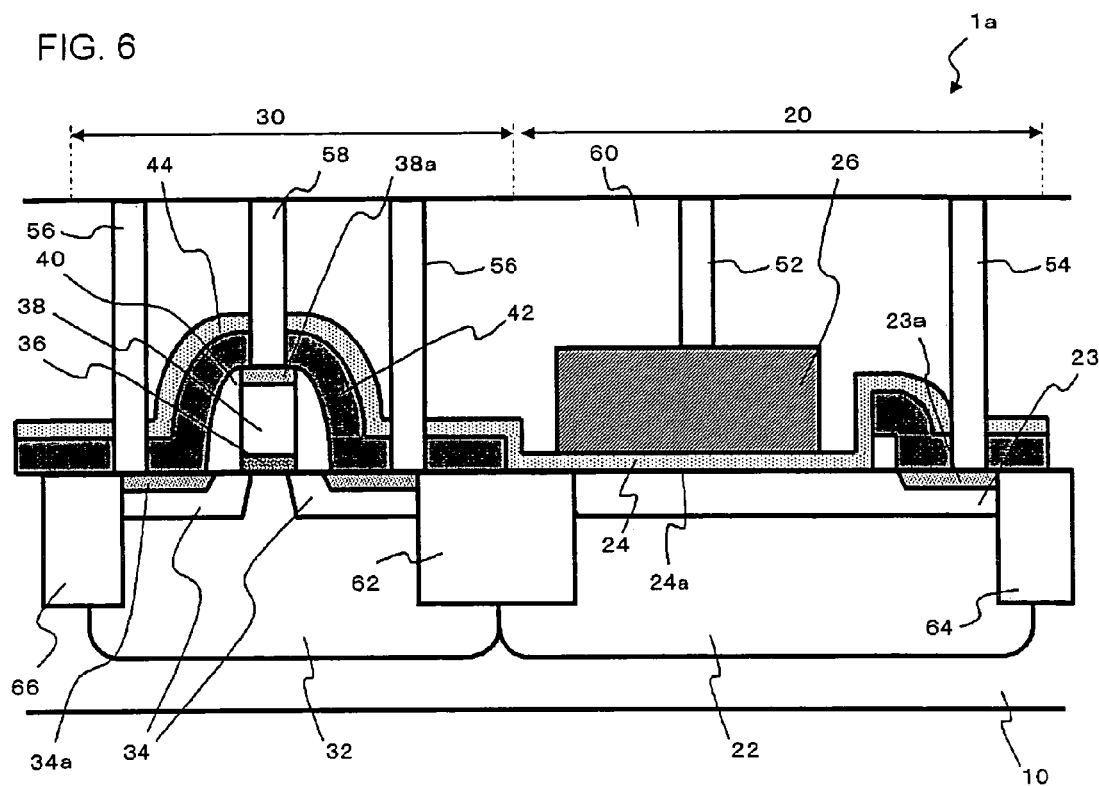
FIG. 6 is a sectional view showing a variation of the semiconductor device 1 shown in FIG. 1.

FIG. 6 is a sectional view showing a variation of the semiconductor device 1, shown in FIG. 1. In a semiconductor device 1a, the STI (STI 68 in FIG. 1) is provided between the upper electrode 26 and the lower electrode (N-type well 22). Further, the diffusion layer 23 is formed all over a region of surface layer of the N-type well 22 which is surrounded by the STIs 62 and 64. The remaining part of configuration of the semiconductor device 1a is similar to that of the semiconductor device 1.

Figure 7:
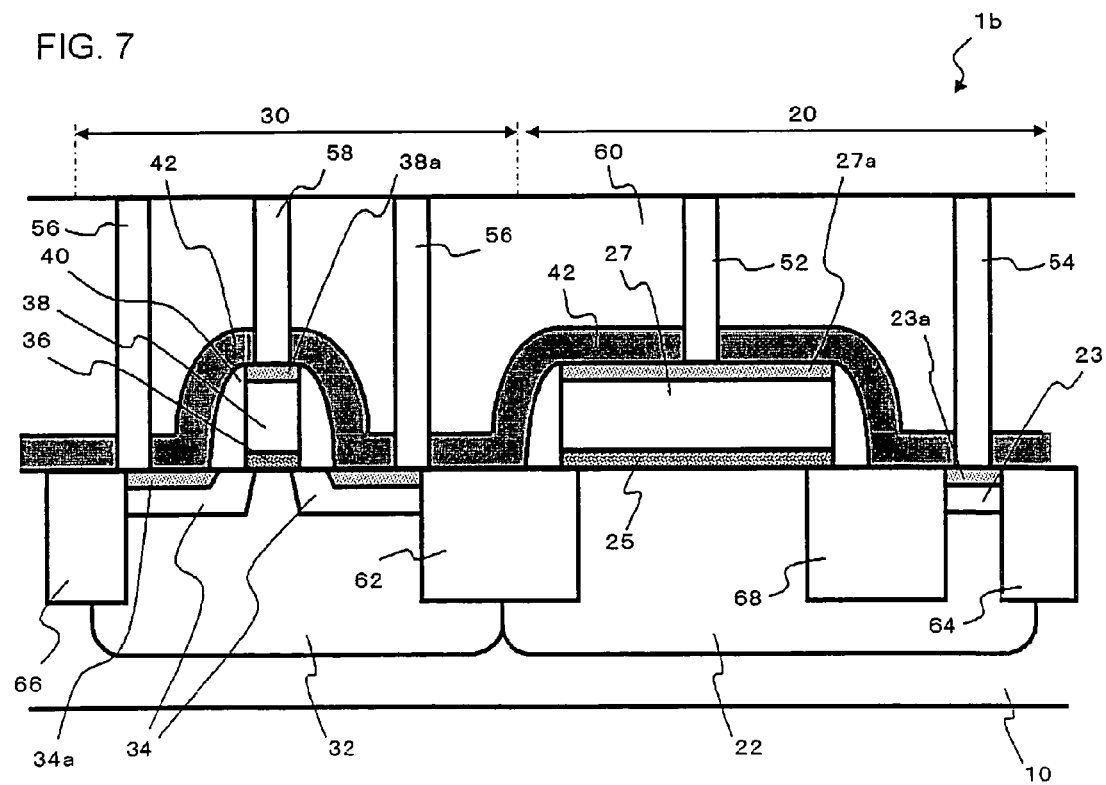
FIG. 7 is a sectional view showing a variation of the semiconductor device 1 shown in FIG. 1.

FIG. 7 is a sectional view showing another variation of the semiconductor device 1. In a semiconductor device 1b, a capacitive film 25 is provided on the flat surface of the semiconductor substrate 10. The capacitive film 25 is formed of the same material as that of the gate insulating film 36. The capacitive film 25 has substantially the same film thickness as that of the gate insulating film 36. Moreover, an upper electrode 27 is provided on the capacitive film 25. The upper electrode 27 is formed of the same material as that of the gate electrode 38. The upper electrode 27 has substantially the same film thickness as that of the gate electrode 38. Moreover, a surface layer 27a of the upper electrode 27 which is opposite the semiconductor substrate is silicided to form a silicide layer. The surface layer 27 is silicided using the same material as that for a surface layer 37a. The surface layer 27 has substantially the same film thickness as that of the surface layer 37a. Furthermore, in the semiconductor device 1b, the interlayer nitride film 42 covers both transistor and capacitive element.

In the semiconductor device 1b, the capacitive film 25 and the gate insulating film 36 can be simultaneously formed, with the upper electrode 27 and the gate electrode 38 simultaneously formed, by stacking a high dielectric-constant film and a polysilicon film on the front surface of the semiconductor substrate 10 and then executing a normal lithography step. Moreover, the surface layers 27a and 38a can be simultaneously silicided in accordance with a normal method. At the same time, the surface layers 23a and 34a can be silicided.

Also in the semiconductor devices 1a and 1b, configured as descried above, the capacitive film 25 is provided on the substantially flat part of the semiconductor substrate 10. Thus, each of the semiconductor devices 1a and 1b comprise a capacitive element with a very uniform capacity value. In particular, in the semiconductor device 1b, the capacitive film 25 and upper electrode 27 in the capacitive element have the same layer structures as those of the gate insulating film 36 and gate electrode 38 in the transistor, respectively. Thus, the capacitive film 25 and the gate insulating film 36 can be formed during the same step. The upper electrode 27 and the gate electrode 38 can be formed during the same step. Therefore, the semiconductor device 1b enables the manufacturing process to be particularly simplified.

It is apparent that the present invention is not limited to the above embodiment, that may be modified and changed without departing from the scope and spirit of the invention.

What is claimed is:

1. A semiconductor device comprising:
   a semiconductor substrate having a conductive layer provided in a surface layer;
   a capacitive film provided on a substantially flat part of a front surface; and
   an upper electrode provided on the capacitive film and constituting a capacitive element together with a conductive layer lying opposite the upper electrode across the capacitive film; and
   a transistor provided on the semiconductor substrate and constituting an internal circuit of the semiconductor device;
   wherein said capacitive element and said transistor are respectively provided on different wells;

further comprising means for preventing diffusion of metal elements from the capacitive film to the semiconductor substrate.

2. The semiconductor device of claim 1, wherein the means for preventing diffusion of metal comprises an insulating film disposed between the capacitive film and the semiconductor substrate.

3. The semiconductor device of claim 2, wherein the insulating film comprises a material that is different from a material that makes up the capacitive film and different from a material that makes up the semiconductor substrate.

4. The semiconductor device of claim 2, wherein the capacitive film comprises at least one composition selected from a group consisting of Zr, Hf, Pr, La, Lu, Eu, Yb, Sm, Ho, Ce, Al, In, Ga, and oxides of Zr, Hf, Pr, La, Lu, Eu, Yb, Sm, Ho, Ce, Al, In, and Ga.

5. The semiconductor device of claim 4, wherein the insulating film comprises $SiO_2$.

6. The semiconductor device of claim 4, wherein the capacitive film comprises a composition selected from a group consisting of $ZrO_x$, $HfO_2$, HfSiO, $HfO_x$, $HfAlO_x$, $Al_2O_3$, $In_2O_3$, and $Ga_2O_3$.

7. The semiconductor device of claim 1, wherein the capacitive film comprises at least one composition selected from a group consisting of Zr, Hf, Pr, La, Lu, Eu, Yb, Sm, Ho, Ce, Al, In, Ga, and oxides of Zr, Hf, Pr, La, Lu, Eu, Yb, Sm, Ho, Ce, Al, In, and Ga.

8. The semiconductor device of claim 7, wherein the capacitive film comprises a composition selected from a group consisting of $ZrO_x$, $HfO_2$, HfSiO, $HfO_x$, $HfAlO_x$, $Al_2O_3$, $In_2O_3$, and $Ga_2O_3$.

9. The semiconductor device as set forth in claim 1, wherein the part of the semiconductor substrate in which the transistor is provided is silicided; and
wherein the part of the semiconductor substrate in which the capacitive film is provided is not silicided.

10. The semiconductor device as set forth in claim 1, wherein said capacitive element and said transistor are respectively provided on different conductive types of wells.

11. A semiconductor device comprising:
a semiconductor substrate having a conductive layer provided in a surface layer;
a capacitive film provided on a substantially flat part of a front surface; and
an upper electrode provided on the capacitive film and constituting a capacitive element together with a conductive layer lying opposite the upper electrode across the capacitive film; and
a transistor provided on the semiconductor substrate and constituting an internal circuit of the semiconductor device;
wherein said capacitive element and said transistor are respectively provided on different wells,
wherein the capacitive film is a high dielectric-constant film having a higher dielectric constant than a silicon oxide film.

12. A semiconductor device comprising:
a semiconductor substrate having a conductive layer provided in a surface layer;
a capacitive film provided on a substantially flat part of a front surface; and
an upper electrode provided on the capacitive film and constituting a capacitive element together with a conductive layer lying opposite the upper electrode across the capacitive film; and
a transistor provided on the semiconductor substrate and constituting an internal circuit of the semiconductor device;
wherein said capacitive element and said transistor are respectively provided on different wells,
wherein the capacitive film is thicker than a gate insulating film in the transistor.

13. The semiconductor device as set forth in claim 12, wherein the capacitive film has a smaller equivalent electrical thickness than the gate insulating film in the transistor.

14. The semiconductor device as set forth in claim 12, further comprising:
an interlayer nitride film provided on the transistor; and
an insulating film provided on the interlayer nitride film;
wherein the insulating film is integrated with the capacitive film.

15. A semiconductor device comprising:
a semiconductor substrate having a conductive layer provided in a surface layer;
a capacitive film provided on a substantially flat part of a front surface; and
an upper electrode provided on the capacitive film and constituting a capacitive element together with a conductive layer lying opposite the upper electrode across the capacitive film; and
a transistor provided on the semiconductor substrate and constituting an internal circuit of the semiconductor device;
wherein said capacitive element and said transistor are respectively provided on different wells,
wherein the part of the semiconductor substrate in which the capacitive film is provided is not silicided.

16. A semiconductor device comprising:
a semiconductor substrate having a conductive layer provided in a surface layer;
a capacitive film provided on a substantially flat part of a front surface; and
an upper electrode provided on the capacitive film and constituting a capacitive element together with a conductive layer lying opposite the upper electrode across the capacitive film; and
a transistor provided on the semiconductor substrate and constituting an internal circuit of the semiconductor device;
wherein said capacitive element and said transistor are respectively provided on different wells,
wherein the upper electrode comprises a metal film.

17. A semiconductor device comprising:
a semiconductor substrate having a conductive layer provided in a surface layer;
a capacitive film provided on a substantially flat part of a front surface; and
an upper electrode provided on the capacitive film and constituting a capacitive element together with a conductive layer lying opposite the upper electrode across the capacitive film; and
a transistor provided on the semiconductor substrate and constituting an internal circuit of the semiconductor device;
wherein said capacitive element and said transistor are respectively provided on different wells,
wherein the upper electrode is formed of polysilicon and a silicide layer is formed in a surface layer of the upper electrode.

18. The semiconductor device as set forth in claim 17, wherein the semiconductor substrate has a capacitive element formation region and a transistor formation region, and the capacitive film, upper electrode, and silicide layer stacked on the front surface of the semiconductor substrate in the capacitive element formation region are formed of the same materials as those of the gate insulating film, gate electrode, and silicide layer, respectively, which are stacked on the front surface of the semiconductor substrate in the transistor formation region, the capacitive film, upper electrode, and silicide layer having substantially the same film thicknesses as those of the gate insulating film, gate electrode, and silicide layer.

19. A semiconductor device comprising:

a semiconductor substrate having a conductive layer provided in a surface layer;

a capacitive film provided on a substantially flat part of a front surface; and an upper electrode provided on the capacitive film and constituting a capacitive element together with a conductive layer lying opposite the upper electrode across the capacitive film; and a transistor provided on the semiconductor substrate and constituting an internal circuit of the semiconductor device;

wherein said capacitive element and said transistor are respectively provided on different wells, wherein the capacitive film comprises at least one composition selected from a group consisting of Zr, Hf, Pr, La, Lu, Eu, Yb, Sm, Ho, Ce, Al, In, Ga, and oxides of Zr, Hf, Pr, La, Lu, Eu, Yb, Sm, Ho, Ce, Al, In, and Ga.

20. The semiconductor device of claim 19, wherein the capacitive film comprises a composition selected from a group consisting of $ZrO_x$, $HfO_2$, HfSiO, $HfO_x$, $HfAlO_x$, $Al_2O_3$, $In_2O_3$, and $Ga_2O_3$.

* * * * *